(12) United States Patent
Simpson et al.

(10) Patent No.: US 6,483,572 B2
(45) Date of Patent: *Nov. 19, 2002

(54) RETICLE ALIGNMENT SYSTEM FOR USE IN LITHOGRAPHY

(75) Inventors: Craig R. Simpson, Danville, VT (US); Mark S. Lucas, Groton, MA (US)

(73) Assignee: Azores Corporation, Wilmington, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/989,097

(22) Filed: Nov. 20, 2001

(65) Prior Publication Data

US 2002/0085189 A1 Jul. 4, 2002

Related U.S. Application Data

(63) Continuation of application No. 08/228,889, filed on Apr. 18, 1994, now Pat. No. 6,320,644.

(51) Int. Cl.[7] .................. G03B 27/42; G03B 27/54; G03B 27/32

(52) U.S. Cl. ........................ 355/53; 355/67; 355/77

(58) Field of Search .................. 355/30, 52, 53, 355/55, 67, 72–76, 77; 356/399–401; 250/548

(56) References Cited

U.S. PATENT DOCUMENTS

| 4,901,109 A | * | 2/1990 | Mitome et al. | 355/53 |
| 4,937,018 A | * | 6/1990 | Ayata et al. | 355/53 |
| 4,999,669 A | * | 3/1991 | Sakamoto et al. | 355/53 |
| 5,105,025 A | * | 4/1992 | Ohta et al. | 355/53 |
| 5,148,214 A | * | 9/1992 | Ohta et al. | 355/53 |
| 5,262,822 A | * | 11/1993 | Kosugi et al. | 355/53 |
| 5,272,501 A | * | 12/1993 | Nishi et al. | 355/53 |
| 5,281,996 A | * | 1/1994 | Pruning et al. | 355/77 |
| 5,309,197 A | * | 5/1994 | More et al. | 355/53 |
| 5,331,371 A | * | 7/1994 | Mori et al. | 355/53 |

* cited by examiner

Primary Examiner—Henry Hung Nguyen
(74) Attorney, Agent, or Firm—Hamilton, Brook, Smith & Reynolds, P.C.

(57) ABSTRACT

Misalignment errors in a lithographic system resulting from the effect of environmental changes on the lens system itself are detected and corrected. A fiducial on the reticle adjacent to its working area is projected through the lens. A metrology plate carried by the lens holds reference mirrors and detectors. The reference mirrors receive the resultant image and reflect it to detectors in a reflected image plane. This provides feedback to the reticle alignment system as to the extent of misalignment, if any. Correction is made by moving the reticle until alignment is achieved and detected. This motion is achieved by using a reticle chuck with linear motors.

5 Claims, 2 Drawing Sheets

RETICLE ALIGNMENT SYSTEM FOR USE IN LITHOGRAPHY

RELATED APPLICATION(S)

This application is a continuation of application Ser. No. 08/228,889, filed Apr. 18, 1994 now U.S. Pat. No. 6,320,644. The entire teachings of the above application is incorporated herein by reference.

FIELD OF THE INVENTION

The invention relates to a through-the-lens alignment system for use in lithography. In particular, it relates to a system which corrects for alignment errors occurring in the optical system due to the effect of environmental changes, such as change in temperature or atmospheric pressure.

BACKGROUND OF THE INVENTION

One problem in lithography is knowing the position relationship between the camera image and the substrate position.

Present lithographic alignment systems achieve alignment by referencing a fiducial in the reticle to a position of the stage. This assumes that the camera remains stable after the alignment and doesn't drift due to the effect of environmental conditions on the lens system; and, as a result, it provides no assurance that the image doesn't move between alignments, creating a misalignment.

In the present invention, alignment is through the lens, with fiducials in the reticle being projected through the lens system and being aligned with sensors carried by the lens and using a reflected image plane, not the image plane on the stage or substrate.

BRIEF SUMMARY OF THE INVENTION

This invention is directed to correcting misalignment errors resulting from changes in the lens system itself. These errors can arise from factors such as temperature change or change in atmospheric pressure.

A fiducial on the reticle adjacent to its working area is projected through the lens, using a wavelength of light that is compatible with the lens. A metrology plate carried by the lens itself has fold mirrors to receive the resultant image and reflect it to detectors in a reflected image plane. This provides feedback to the reticle alignment system. Thus, if environmental conditions associated with the lens create a misalignment due to camera problems, the extent of the change is detected and continuously corrected.

Since the misalignment is not related to the stage, and is not detected at the stage, it is not corrected by moving the stage. Rather, correction is made by moving the reticle until alignment is achieved and detected. This motion is achieved by having a reticle stage with linear motors to move the reticle until alignment is achieved.

DETAILED DESCRIPTION OF THE INVENTION

Figure 1:
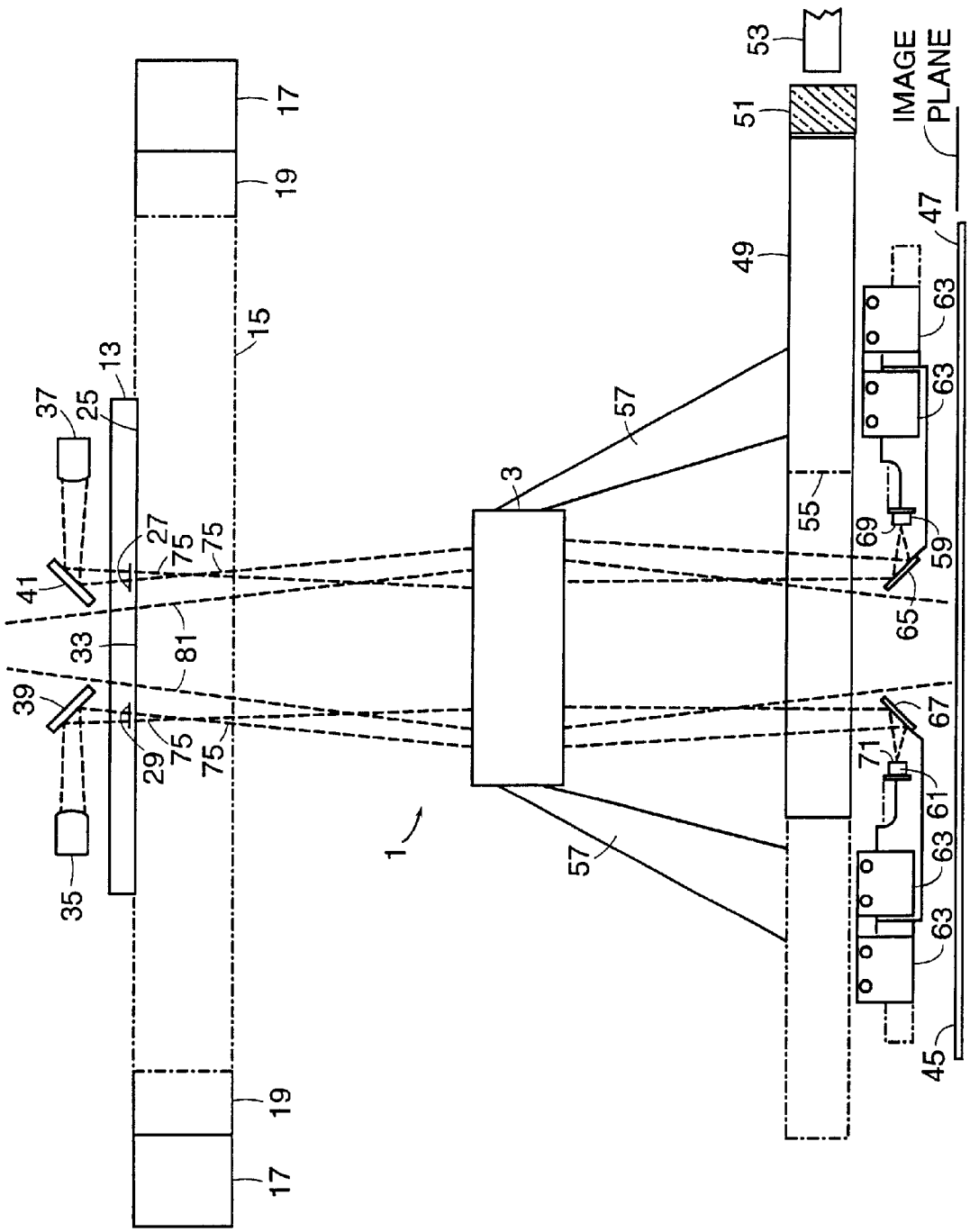
FIG. 1 is a front elevation showing the system.
Figure 2:
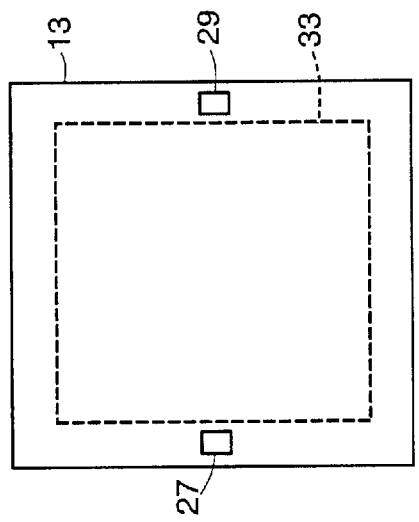
FIG. 2 is a plan view of a reticle showing fiducial marks.

In this system fiducial marks on the reticle, but outside of the working pattern to be projected, are projected through the regular lens system, but at the periphery. These projected images are reflected by folding mirrors mounted on the lens itself and focused on detectors in the reflected image plane. These detectors are capable of measuring the position of the relayed alignment fiducials. Determination of whether or not the projected images of the fiducial marks are in proper alignment, and correction for misalignment, are achieved in the usual manner.

If, due to environmental factors, such as temperature change or atmospheric pressure change, misalignment occurs, the error is detected and corrected immediately. Correction is made by moving the reticle in the correct direction until alignment is achieved as determined by the detectors. As will be appreciated, this avoids the normal system for environmental correction, i.e., periodically stopping production and realigning the stage, and provides continuous correction.

The system includes a normal optical system, such as system 1, with lens 3.

Reticle 13 is carried by reticle chuck 15 which has a supporting frame 17 and linear motors 19 for positioning the reticle 1. Linear motors are shown for x-direction correction, but similar motors can also be used for positioning the y-, z-, and $\ominus$-directions. The reticle 13 carries fiducial (alignment) marks 27 and 29 and the working pattern 33 to be projected. These are in the object plane 25 of lens 3. A pair of marks 27 and 29 referencing the x- and y-directions are shown. A description of one system of linear motors for positioning a reticle will be found in Resor et al. U.S. Pat. No. 4,769,680.

Light sources 35 and 37, such as light pipes, project light beams to folding mirrors 39 and 41 which reflect the beams to the fiducial marks 27 and 29. This serves to project images of the fiducial marks through the peripheral areas of the lens 3 of the optical system 1. The light used should be of a wavelength compatible with the lens system, and preferably of the same wavelength as the light source used to project the pattern itself.

Substrate 45, with image plane 47, is carried on a stage below the lens. It receives an image of pattern 33.

A metrology plate 49, made of a thermally and mechanically stable material such as Invar, is mounted on the lens system itself, slightly below it. Plate 49 has an opening 55 to permit passage of the rays associated with both the pattern and fiducial images. A pair of detectors 59 and 61 are secured in position by mounting brackets 63 carried by metrology plate 49. Thus, to the extent that the optical system 1 is affected by environmental factors, the detectors will be similarly moved, and reflect the changes in the optical system. The position of plate 49 is monitored by mirror 51 reflecting a beam from interferometer 53, which is also used to monitor the position of the substrate. This, of course, can be done in both x- and y-directions.

Each of the detectors 59 and 61 has an associated folding mirror 65 and 67, respectively. These mirrors are also carried by brackets 63, and are positioned just below opening 55 and in the path of the images of the fiducial marks 27 and 29, respectively (but outside of the path of the pattern image). As a result, the images of the marks will be reflected to their respective detectors.

The detectors, in turn, are positioned at the image planes 69 and 71 of the fiducial marks. Accordingly, when the system is in alignment, the fiducial images will be in focus at the detectors; when misaligned due to environmental factors, the detectors will show this misalignment and its extent. Information as to such misalignment, and its extent, is fed back to the reticle alignment, i.e., linear motors 19, so that correction can be made by them. Once aligned, this fact will be determined by the detectors, and corrective measures will cease.

Figure 3:
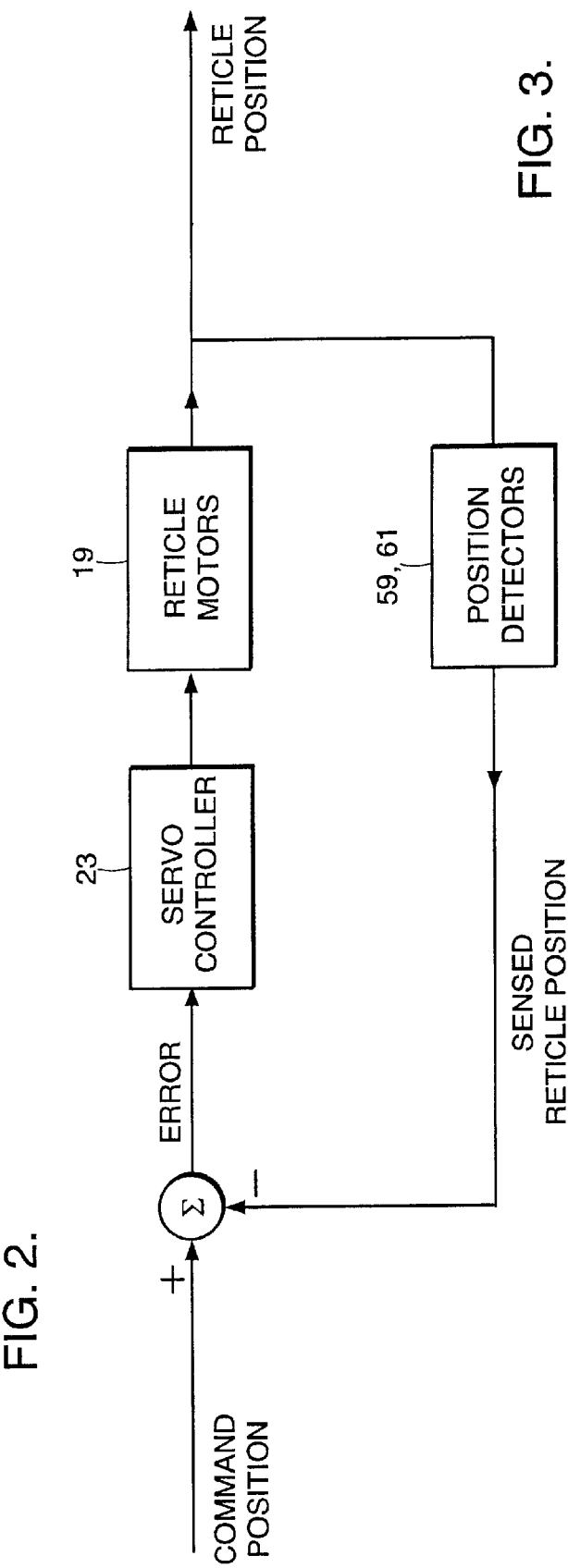
FIG. 3 is a flow chart showing the reticle alignment system.

FIG. 3 shows a flow chart for reticle alignment. A closed loop servo 23 controls the position of the reticle 13 with respect to the detectors 59 and 61. Any positional error goes to the servo controller which controls the reticle motors, re-aligning the reticle.

Various systems of alignment marks and detectors can be used to detect misalignment and correct for it. Examples will be found in the above Resor patent and in Holbrook et al. U.S. Pat. No. 4,885,792. These can be used with the present invention.

It can be seen, therefore, that errors due to environmental factors affecting the lens system are continuously monitored and corrected.

As stated, the images of the fiducial marks go through the peripheral areas of the lens. The extreme rays of these marks are identified at 75, with the image 77 appearing at the image planes 69 and 71 of the detectors. Similarly, the extreme rays 81 of the pattern image pass through the more central area of the lens, and form image 83 on image plane 47 of the substrate. The mirrors are so positioned as to prevent images of the fiducial marks from reaching the substrate and exposing it; but they do not interfere with the image of the working pattern from reaching the substrate.

What is claimed is:

1. In a lithographic alignment system, a method for correcting misalignments resulting from environmental effects on a lens which are unrelated to stage position, the method comprising:

positioning said lens for projecting images therethrough from an object plane to an image plane;

providing a reticle in said object plane, said reticle having a working pattern and a first pair of fiducial marks positioned outside of said working pattern;

illuminating said fiducial marks and projecting images thereof through said lens;

using a device for reflecting said images projected through said lens, reflecting said images to a detector;

detecting said reflected images by said detector in a plane which is a reflection of said image plane;

using a feedback system, operatively associating said detector with said reticle; and aligning the reticle based on said associating in a manner misalignment caused by environmental effects on said lens can be detected and corrected.

2. The method according to claim 1 wherein reflecting said images includes folding the images between said lens and said detector.

3. The method according to claim 1 wherein said reflecting includes preventing said images of said fiducial marks from being projected to an underlying substrate.

4. The method accordingly to claim 1 wherein the detecting includes minimizing errors caused by environmental effects by detecting in real time the environmental effects on said lens.

5. A lithographic alignment system to correct misalignments resulting from environmental effects on a lens which are unrelated to stage position, said alignment system comprising:

means for projecting images from an object plane to an image plane through said lens;

means for holding a reticle in said object plane, said reticle having a working pattern and a first pair of fiducial marks positioned outside of said working pattern;

alignment means for aligning said reticle;

illumination means for illuminating said fiducial marks and projecting images thereof through said lens;

redirection means for redirecting said images;

detection means for detecting the redirected images; and feedback means operatively associating said detection means with said alignment means in a manner misalignment caused by environmental effects on said lens can be detected and corrected.

* * * * *